United States Patent
Bronner et al.

[19]

[11] Patent Number: 6,063,657
[45] Date of Patent: May 16, 2000

[54] METHOD OF FORMING A BURIED STRAP IN A DRAM

[75] Inventors: Gary B. Bronner, Stormville; Ramachandra Divakaruni, Middletown, both of N.Y.

[73] Assignee: International Business Machines Corporation, Armonk, N.Y.

[21] Appl. No.: 09/255,535

[22] Filed: Feb. 22, 1999

[51] Int. Cl.[7] .............................................. H01L 21/8242
[52] U.S. Cl. ......................... 438/244; 438/243; 438/386
[58] Field of Search ................... 438/239, 243, 438/244, 250, 253, 386, 387, 393, 396

[56] References Cited

U.S. PATENT DOCUMENTS

| | | | |
|---|---|---|---|
| 5,049,518 | 9/1991 | Fuse et al. .............................. | 438/386 |
| 5,360,758 | 11/1994 | Bronner et al. ......................... | 438/243 |
| 5,525,531 | 6/1996 | Bronner et al. ......................... | 438/386 |
| 5,960,297 | 9/1999 | Saki ........................................ | 438/296 |

*Primary Examiner*—Charles Bowers
*Assistant Examiner*—Jack Chen
*Attorney, Agent, or Firm*—McGinn & Gibb, P.C.; Daryl K. Neff, Esq.

[57] ABSTRACT

A method and structure for forming a buried strap in a dynamic random access memory structure. The method includes forming a trench adjacent a pass transistor of the dynamic random access memory structure, partially filling the trench with a conductor, forming a collar surrounding an upper portion of the conductor, forming a spacer in a portion of the trench above the conductor, forming an insulator in a remainder of the upper portion of the trench, forming a shallow trench isolation region on one side of the trench opposite the pass transistor, removing the spacer to form a gap between the insulator and the pass transistor, and filling the gap with a conductor to form the buried strap.

20 Claims, 7 Drawing Sheets

PRIOR ART

METHOD OF FORMING A BURIED STRAP IN A DRAM

BACKGROUND OF THE INVENTION

1. Field of the Invention

The present invention generally relates to storage devices and more particularly to an improved process for forming a strap in a deep trench storage device.

2. Description of the Related Art

Trench storage cells are used in dynamic random access memory (DRAM) products due to the high degree of planarity obtainable with the trench structure during chip processing. One of the challenges associated with trench DRAM processing is the formation of an electrical connection between the trench capacitor and the diffusion region of the array device pass transistor.

Conventionally, as shown in FIG. 1F, a "buried strap" 120 connection is made between the top of a trench 100 and a diffusion region (i.e., drain 134) of a transistor 130. The buried strap 120 connection eliminates the requirement for a distinct lithographic patterning level.

More specifically, the conventional process of forming a buried strap is illustrated in FIGS. 1A–1F. FIG. 1A illustrates a trench 100 which is formed in a substrate 101 to a depth greater than 5 $\mu$m below a pad silicon nitride layer 104 by conventional means such as photolithography and dry etching using a mixture of gases which may include $Cl_2$ Hbr, $O_2$, $N_2$, $NF_3$, $SF_6$, and $CF_4$. Then a collar dielectric oxide 103 (such as silicon dioxide or silicon oxynitride) is deposited over the pad nitride 104 and trench 100.

As shown in FIG. 1B, the collar oxide is etched in an anisotropic dry etching process, such as reactive ion etching (RIE), using a mixture of gases which may include some portions of $CHF_3$, Ar, $O_2$, $C_4F_8$, and CO. The anisotropic dry etch, or sidewall spacer etch, removes material in a vertical direction at a higher rate than it removes material in the horizontal direction. Therefore, the highly selective anisotropic spacer etch will leave material along the sidewall of the trenches, and remove material from the horizontal surfaces.

As shown in FIG. 1C, the trench is then filled with a second level of polysilicon 110. The second level of polysilicon is then recessed to a depth of less than using 0.1 $\mu$m a dry or wet etch. Also, as is well known to those ordinarily skilled in the art, a LOCOS (e.g., local oxidation of silicon) collar may be formed followed by a recess to achieve the structure shown in FIG. 1D. Then, as shown in FIG. 1D, the collar oxide is etched down to the second level of polysilicon 110 using a wet etch, such as HF.

A third level of polysilicon 120 is deposited and the structure is planarized and recessed below the pad nitride 104 using a dry etch process, as shown in FIG. 1E. The third level of polysilicon 120 becomes the strap which contacts the diffusion area of the transistor.

The structure shown in FIG. 1E is formed in conjunction with a transistor 130, such as a metal oxide semiconductor field effect transistor (MOSFET), which is illustrated in FIG. 1F. More specifically, the transistor includes a gate 131, a gate oxide 132, a source region 133, a drain region 134 and a shallow trench isolation (STI) region 135. The process of forming such a transistor 130 is well known to those ordinarily skilled in the art.

The third level of polysilicon 120 is the strap and forms an electrical connection between the first and second layers of polysilicon 102, 110 and the source/drain 134 of the transistor 130. This type of strap is known as a buried strap because it exists below the top surface of the substrate 101. By utilizing such a buried strap, the size of the semiconductor device can be reduced and, since an external strap is not required, the chance of damage to other structures within the semiconductor device is also reduced.

However, conventional processes indirectly cause the strap 120 to be recessed 121 with respect to the silicon 101 and pad nitride 104 surface when the active area isolation (e.g, the STI region 135) is formed. This non-planarity 121 causes severe problems during the subsequent lithography and disrupts overlay tolerance when printing the critical active area (AA) structures in the array.

Further, the conventional process of manufacturing deep trench DRAM structures does not allow accurate control of the strap depth. If the strap is too deep it limits the scaling and array threshold voltage (Vt) control of the active transfer device. The depth of the strap is conventionally controlled by the difference between the depth of the recess of the second polysilicon layer 110 and the depth of the recess of the third polysilicon layer 120 in the array. However, controlling the depth of the strap in this manner causes the strap resistance to be a function of not only both the recess depths, but also of the strap wet etch, which substantially reduces the accuracy of the strap depth.

While some conventional methods allow vertical scaling of the buried strap using a pad nitride pull back to form the strap, such methods cause non-planar wafers to be formed after the deep trench sector and involve significant modifications in the active area processing to ensure the prevention of strap erosion.

Therefore, there is need for a system which will eliminate the lithographic problems caused by the uneven surface of the trench and which allows more precise control over the depth of the strap.

SUMMARY OF THE INVENTION

It is, therefore, an object of the present invention to provide a structure and method for forming a buried strap in a dynamic random access memory structure. The method includes forming a trench adjacent a pass transistor of the dynamic random access memory structure, partially filling the trench with a conductor, forming a collar surrounding an upper portion of the conductor, forming spacers on sides of the trench above the conductor, forming an insulator in a remainder of the upper portion of the trench, forming a shallow trench isolation region on one side of the trench capacitor opposite the pass transistor, removing the spacer to form a gap between the insulator and the pass transistor, and filling the gap with a conductor to form the buried strap.

The step of forming the insulator includes planarizing the insulator over the dynamic random access memory structure. The invention also includes filling the shallow trench isolation region with an isolation material. Also, before the forming of the insulator, the invention may include forming an etch stop material over the conductor. The step of removing the spacer comprises applying an etchant that removes the spacer at a higher rate that it removes the insulator.

Additionally, before the filing of the gap with the conductor, the invention includes etching the collar to control a depth of the buried strap. The spacer may be Boron Phosphorus Silicate Glass (BPSG), Phosphorus Silicate Glass (PSG) Boron Silicate Glass (BSG), non-densified Ozone TEOS (tetraethylorthosilicate) or PETEOS (plasma enhanced tetraethylorthosilicate). The insulator may be oxynitride or tetraethylorthosilicate.

Since the shallow trench isolation region is formed before the strap, the active area mask is formed over the planar surface of the insulating material which avoids the problems caused by the non-planer surface of the conventional structure illustrated in FIG. 1E (e.g., recess 121). Therefore, the lithographic and overlay processes used in the formation of the active area are much more accurate with the invention than with conventional systems.

Further, the wet etch process of the spacer provides very precise control over the depth of the gap formed for the strap. By minimizing the variation of the depth of the strap, the invention produces substantially better control of the strap resistance and associated array threshold voltage (Vt) of the active transfer device.

Thus, the invention forms the buried strap after the active area pattern definition, ensuring that the wafers are planar for improved active area lithography. Also, the strap is fully scalable in that the strap resistance is a function of only one recess and wet etch.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
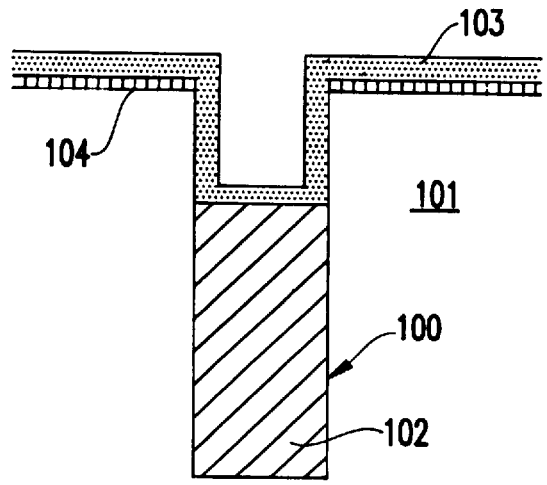
FIGS. 1A–1F are schematic diagrams of a conventional buried strap method and structure.
Figure 1B:
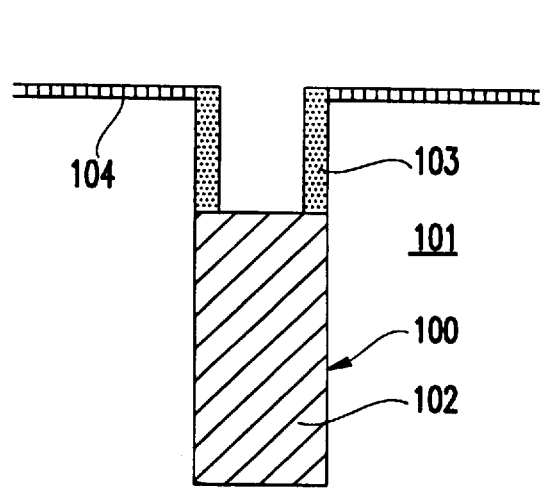
Figure 1C:
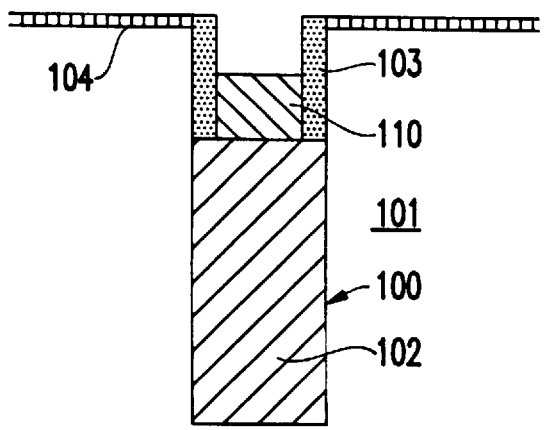
Figure 1D:
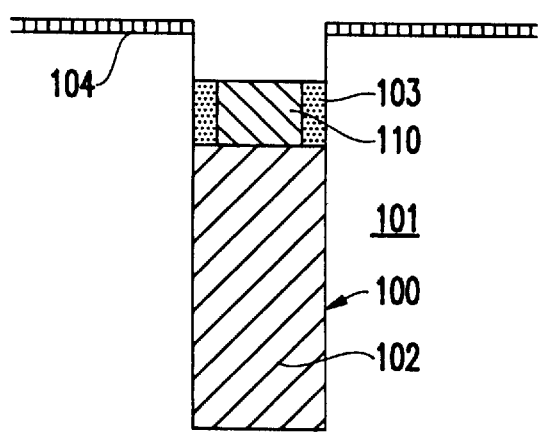

Referring now to the drawings and more particularly to FIGS. 2A–2G, a first embodiment of the invention is illustrated. Many of the details of the trench capacitor and the associated pass transistor formation are discussed in the Background section and a redundant discussion is not repeated here for the sake of brevity.

Figure 1E:
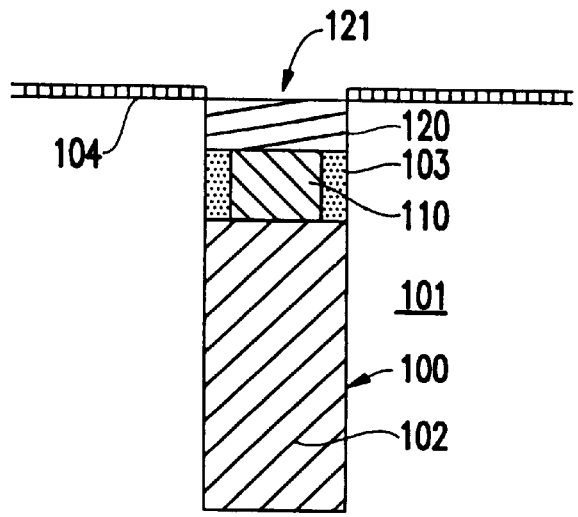
Figure 1F:
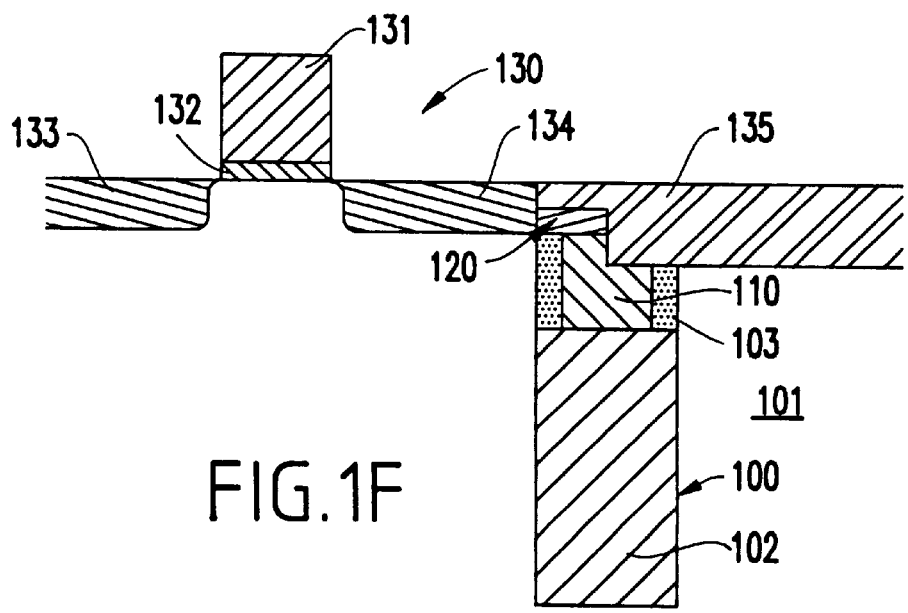
Figure 2A:
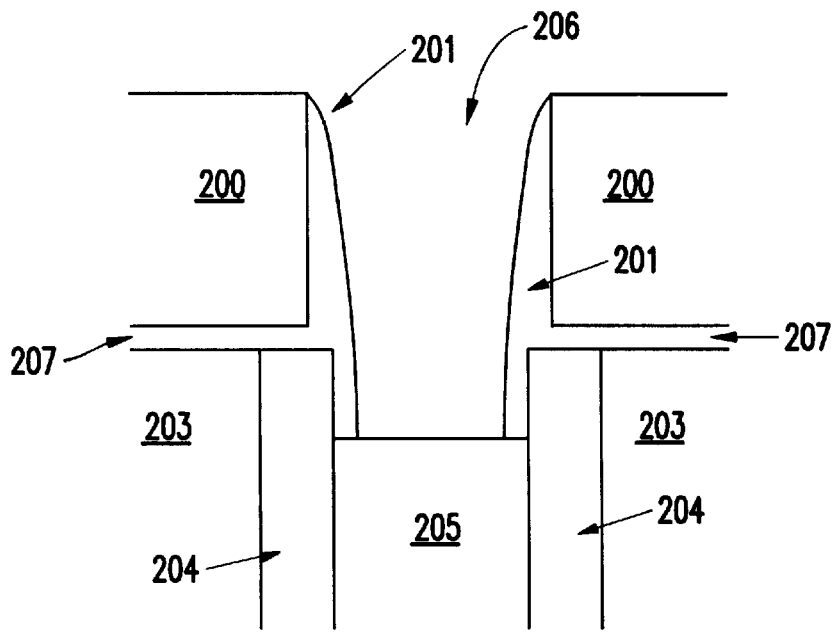
FIGS. 2A–2G are schematic diagrams of a buried strap method and structure according to the invention.

More specifically, as shown in FIG. 2A, a deep trench structure is formed in a substrate 203, such as a single crystal silicon substrate. FIG. 2A only illustrates a portion of a deep trench structure and its associated pass transistor, which is more fully shown in FIGS. 1A–1F.

The upper portion of a trench 206 within the silicon substrate 203 is lined with a collar oxide 204 and the area within the collar oxide 204 is filled with an upper portion of a deep trench conductor 205. The structure also includes a thin insulator layer 207 and a nitride layer 200 such as a silicon nitride pad. The depth of the deep trench 206 which remains above the deep trench conductor 205 is scaled as the active transistor dimension is scaled. The process of forming such structures is well known to those ordinarily skilled in the art and is discussed above with respect to FIGS. 1A–1F.

Thin spacers 201, such as oxide spacers, are formed, for example, by depositing a thin layer of doped glass such as Boron Phosphorus Silicate Glass (BPSG), Phosphorus Silicate Glass (PSG), Boron Silicate Glass (BSG), Ozone TEOS (tetraethylorthosilicate), etc. in, for example, a chemical vapor deposition (CVD) process. The spacers 201 are etched in, for example, an anisotropic etching process, which etches horizontal surfaces at a much greater rate than it etches vertical surfaces, to produce the spacers 201 shown in FIG. 2A. The material used for the thin insulating layer 207 may be (but is not generally) the same material used for the spacers 201 and, therefore, the drawings illustrate the thin insulating layer 207 and the spacers 201 as a continuous material.

Figure 2B:
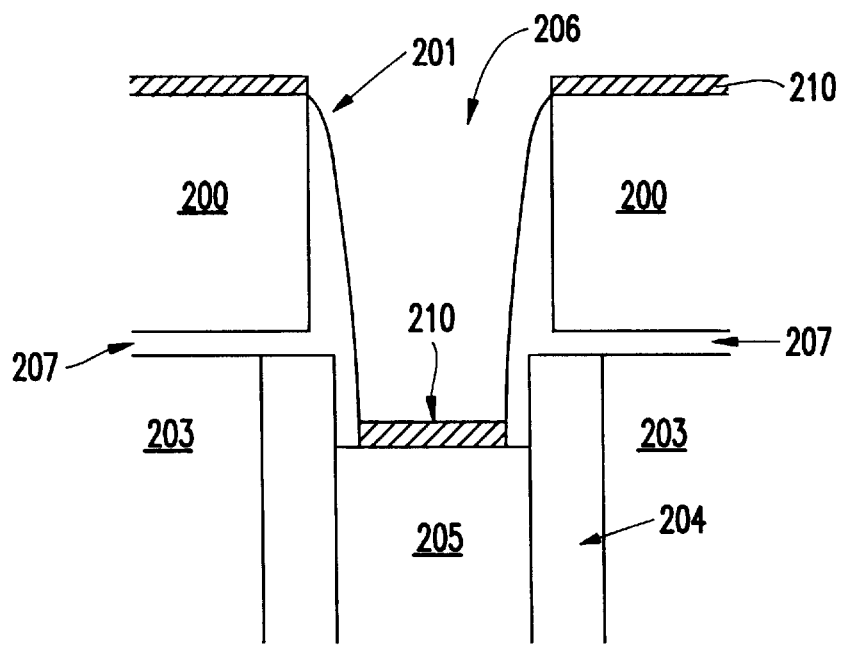
Figure 2C:
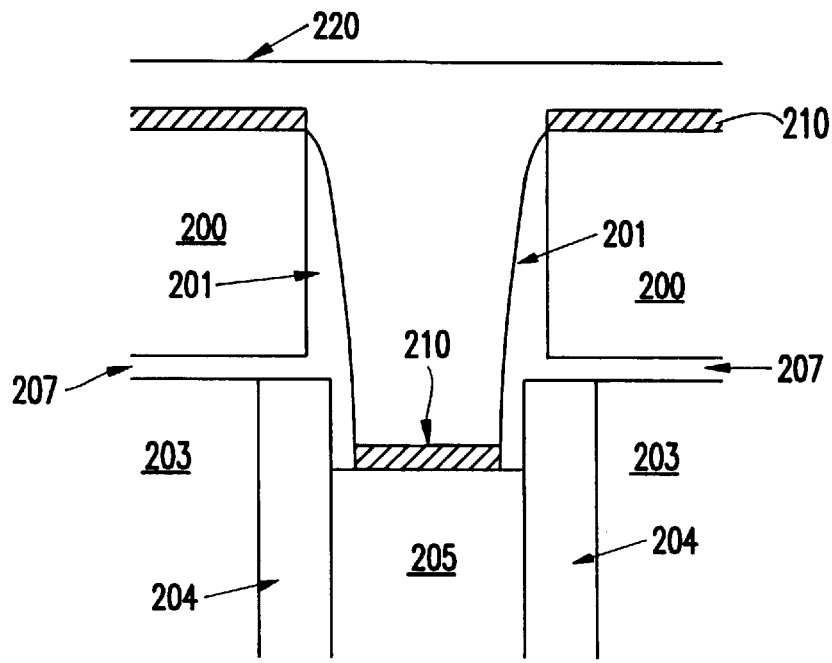

As shown in FIG. 2B, an etch stop material 210 is deposited using a process which deposits material only on horizontal surfaces. For example, the etch stop material 210 could comprise silicon, $WSi_x$, TiN, etc. and the deposition process could comprise sputtering, high density plasma deposition, etc. A conformal insulating material 220 is deposited over the entire structure and into the trench 206. The conformal insulating material 220 is selected so that it will not be stripped by the pad nitride strip at the end of trench isolation formation. For example, the material 220 could be, oxynitride, a layered film of SiN and TEOS, or a layered film of oxynitride, TEOS and SiN or any combination which would allow etching selective to the etch stop and the side wall during the spacer removal.

Figure 2D:
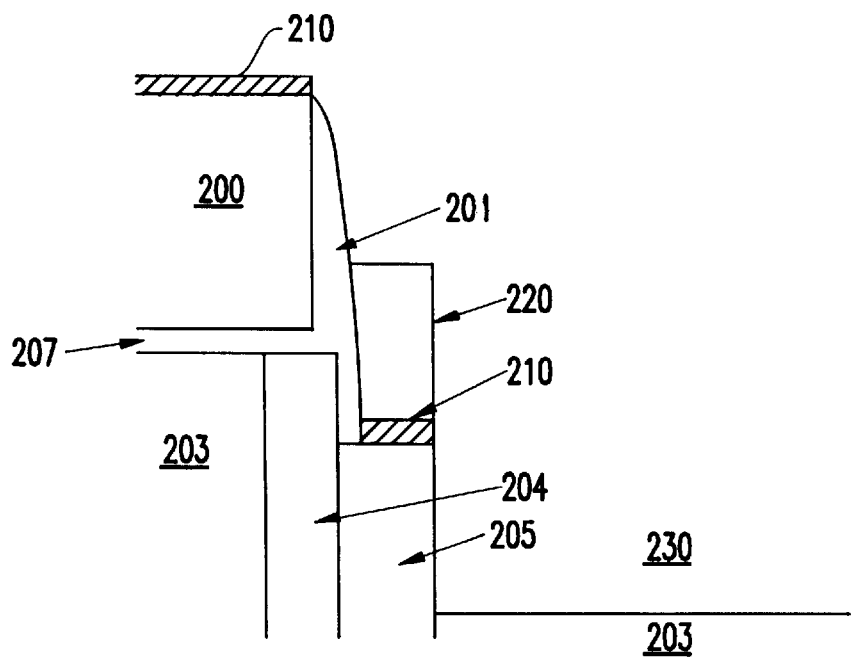

In FIG. 2D, the shallow trench 230 of the shallow trench isolation (STI) region is formed using active area masking and etching processes. The etching of the isolation region 230 exposes a portion of the deep trench conductor 205, the etch stop layer 210, the insulating material 220 and the spacer 201, as shown in FIG. 2D. The layer 220 is etched selectively to the spacer material 201 using etching solutions (or dry etching) well known to those ordinarily skilled in the art, such as those mentioned above.

Therefore, since the active area mask is formed over the planer surface of the insulating material 220, the problems caused by the non-planer surface of the conventional structure illustrated in FIG. 1E (and more specifically the recesses 121, discussed above) are avoided. Therefore, the lithographic and overlay processes used in the formation of the active area (and the associated shallow trench isolation region 230) are much more accurate with the invention than with conventional systems.

The structure is then etched with a selective etching solution which removes the spacer material 201 (e.g., oxide spacer) at a fast rate but which removes the insulating material 220 (e.g., oxynitride), the pad material 200 (e.g., silicon nitride), the substrate material 203 (e.g., silicon) and the etch stop material 210 (e.g., silicon) at a much slower rate. As would be known by one ordinarily skilled in the art given this disclosure, the selective etching solution utilized will vary depending upon the materials used for the spacer and other elements of the deep trench capacitor. For example, such selective etching solutions could include HF vapor, Buffered HF, and aqueous solution of Sulphuric Peroxide or other such chemicals well known to those ordinarily skilled in the art.

Figure 2E:
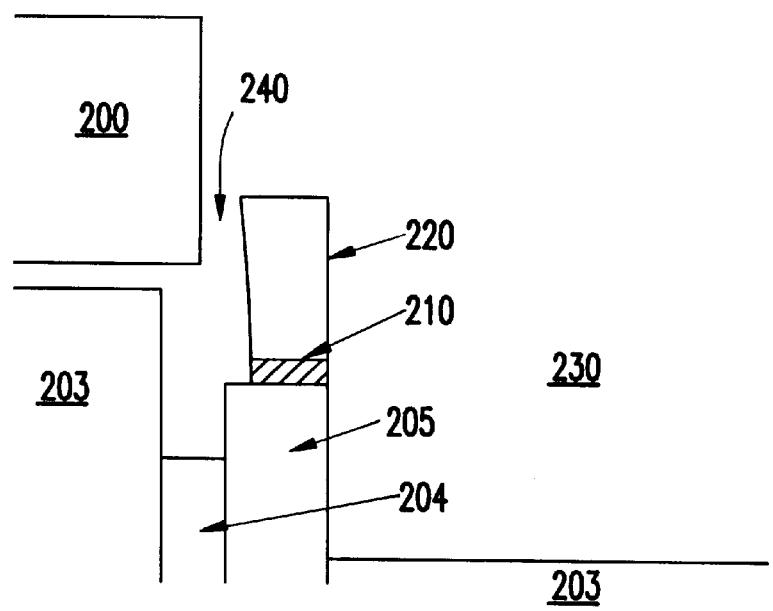

As shown in FIG. 2E, the selective etching process produces a gap 240 between the insulating material 220, the substrate 203 and pad material 200. Then, a wet etch, such as Buffered HF is used to etch the collar 204 to a desired depth. This process provides very precise control over the depth of the gap formed for the strap because the amount of collar material 204 which is removed can be precisely controlled by varying the time of the wet etch or varying the concentration of the solution utilized. Therefore, when the strap is formed, as discussed below, the threshold voltage tolerance of the array can be precisely controlled by minimizing the strap depth.

Figure 2F:
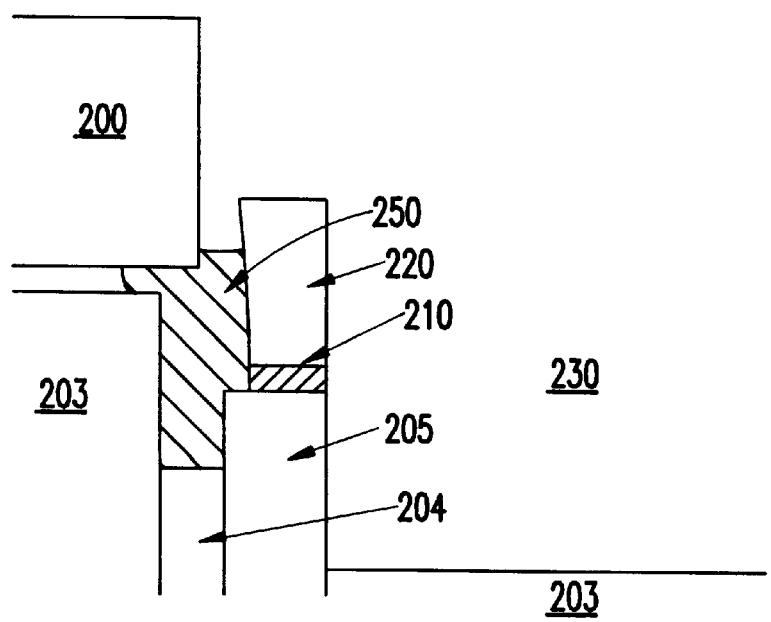

As shown in FIG. 2F, a thin conductive layer 250 which completely fills the gap 240 is formed. The conductive material 250 is selected to be very conformal such that it will completely fill the gap 240. For example, polysilicon, $WSi_x$ or TiN and other similar materials may be utilized as the conductive material 250 In addition, a thin interface of SiN or $SiO_2$ may be formed in the gap 240 prior to the application of the conductive layer 250, to prevent dislocations in the single crystal silicon substrate 203. The conductive material is cleared everywhere else from the structure and is partially etched into the gap 240 with a RIE etch or chemical downstream low density etch known to those ordinarily skilled in the art.

Figure 2G:
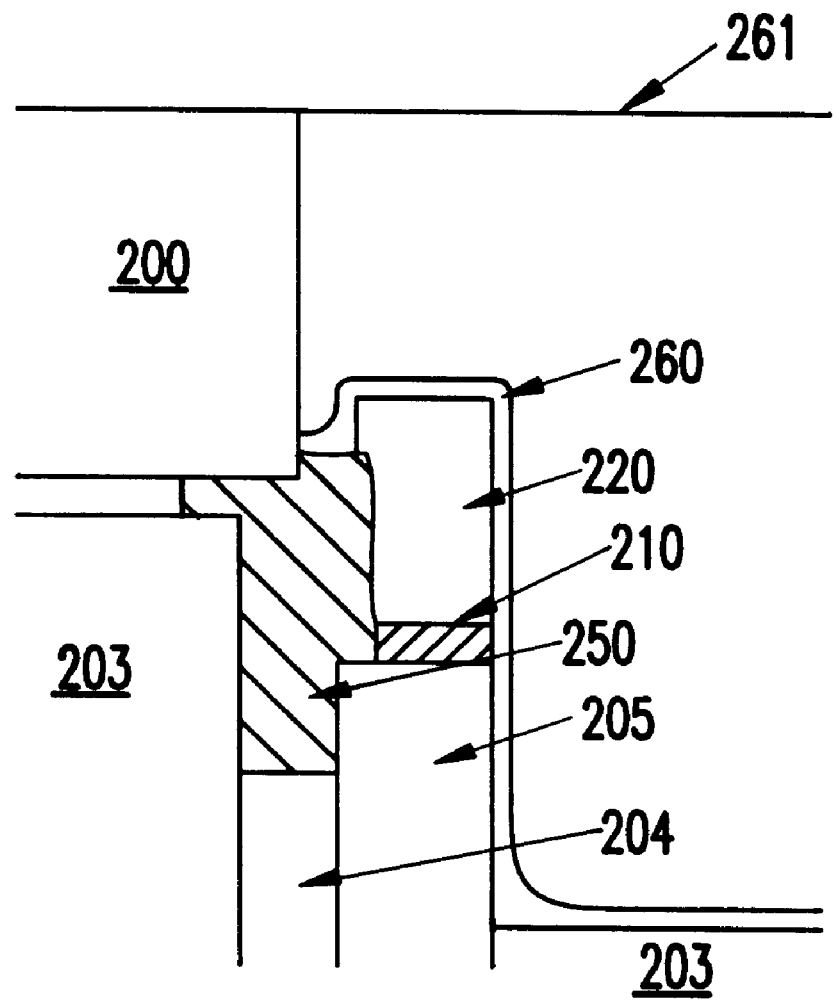

Then, the shallow trench isolation region 230 is completed. More specifically, as shown in FIG. 2G, the active area is oxidized to, for example, 100 Å at, for example, 1000° C. A liner 260 such as a silicon nitride liner is optionally deposited within the shallow trench 230. Then an insulator 261 is deposited within the shallow trench 230 using, for example, a high density plasma (HDP) or a chemical vapor deposition (CVD). Finally, the structure is planarized using, for example, chemical mechanical polishing (CMP) to form the final structure illustrated in FIG. 2G.

As an alternative to the above, after the spacer 201 is removed, an active area oxidation may be performed, the oxide may be reactive ion etched in the crevice 240 (as in FIG. 2E) and the polysilicon 250 can be filled and recessed (as in FIG. 2F). This alternative would have the high thermal budget active area oxidation done before the strap is formed, thereby reducing the strap outdiffusion.

Figure 3A:
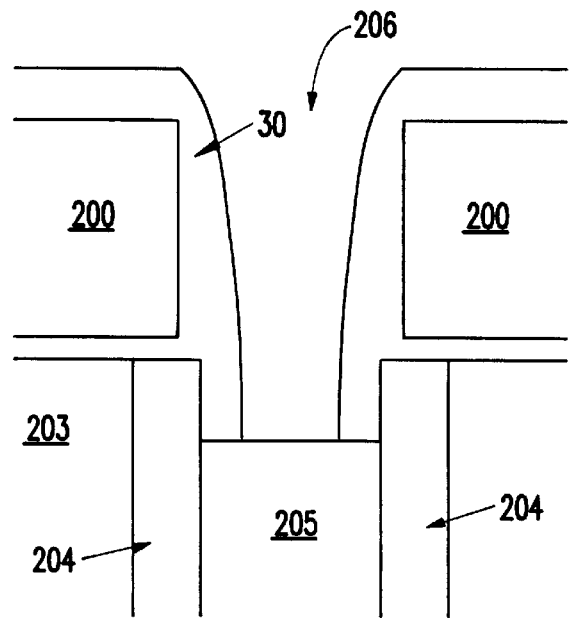
FIGS. 3A and 3B are schematic diagrams of a buried strap method and structure according to the invention.
Figure 3B:
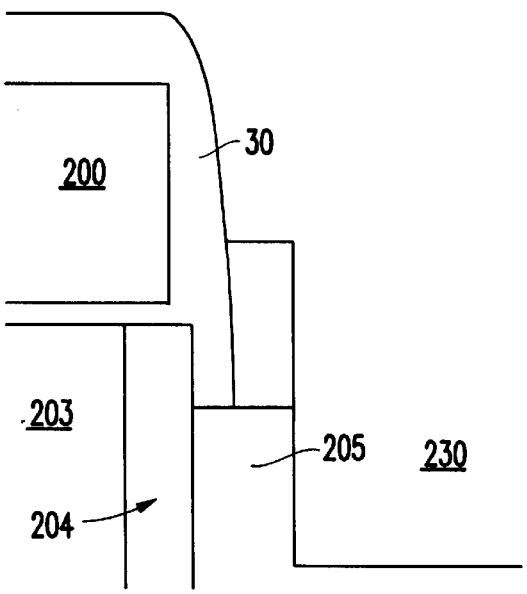

Another embodiment of the invention is illustrated in FIGS. 3A and 3B. More specifically, instead of forming the separate sidewall spacers 204 and the etch stop material 210, as shown in FIG. 2B, a single insulator layer 30 is deposited. For example, a blanket film of tetraethylorthosilicate (TEOS) or other similar oxide could be deposited in a chemical vapor deposition early in the process to produce the structure shown in FIG. 3A. The processing discussed above with respect to FIGS. 2C and 2D is applied to the structure shown in FIG. 3A to produce the structure shown in FIG. 3B. Then, as discussed above, the remaining processes shown in FIGS. 2E–2G are applied to this embodiment to complete the formation of the strap. The second embodiment does not require the etch stop layer 210 (Si/$WSi_x$/TiN) because the TEOS acts as an etch stop for the SiN etch. Also, the film on top of the pad SiN could be TEOS, and the spacer could be doped glass.

Figure 4:
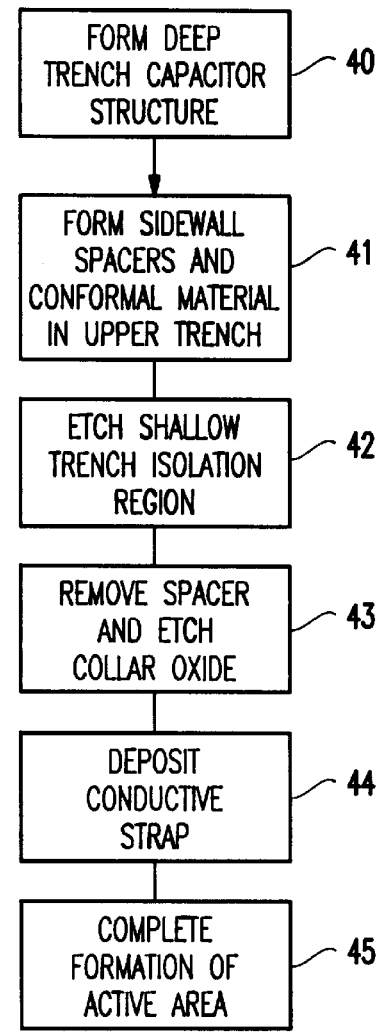
FIGS. 4 is a flow diagram illustrating a preferred method of the invention.

A flowchart representation of an embodiment of the invention is shown in FIG. 4. More specifically, the deep trench capacitor structure shown in FIG. 2A is formed in item 40. The sidewall spacers 201 and insulating material 220 are formed in item 41. The shallow trench 230 is formed in item 42. The removal of the spacer 201 and etching of the collar oxide 204 (to form the gap 240) are shown in item 43. The conductive strap 250 is deposited in item 44 and the completion of the structure, as shown in FIG. 2G, is represented in item 45.

As described above, since the shallow trench 230 is formed before the strap 250, the active area mask is formed over the planer surface of the insulating material 220 which avoids the problems caused by the non-planer surface of the conventional structure illustrated in FIG. 1E (e.g., recess 121). Therefore, the lithographic and overlay processes used in the formation of the active area are much more accurate with the invention than with conventional systems.

Further, the wet etch process of the spacer 204 provides very precise control over the depth of the gap formed for the strap 250. By minimizing the variation of the depth of the strap 250, the invention produces substantially better control of the strap resistance and associated array threshold voltage (Vt) of the active transfer device.

Thus, the invention forms the buried strap after the active area pattern definition, ensuring that the wafers are planar for improved active area lithography. Also, the strap is fully scalable in that the strap resistance is a function of only one recess and wet etch. The buried strap is thus scalable as its depth is controlled by a single wet etch.

While the invention has been described in terms of preferred embodiments, those skilled in the art will recognize that the invention can be practiced with modification within the spirit and scope of the appended claims.

What is claimed is:

1. A method of forming a buried strap in a dynamic random access memory structure, said method comprising:

forming a trench adjacent a transistor of said dynamic random access memory structure;

partially filling said trench with a conductor;

forming a collar surrounding an upper portion of said conductor;

forming a spacer on a side of said trench above said conductor;

forming an insulator in a remainder of said upper portion of said trench;

forming a shallow trench isolation region on one side of said trench opposite said transistor;

removing said spacer to form a gap between said insulator and said transistor; and filling said gap with a conductor to form said buried strap.

2. The method in claim 1, wherein said step of forming said insulator includes planarizing said insulator over said dynamic random access memory structure.

3. The method in claim 1, further comprising filling said shallow trench isolation region with an isolation material.

4. The method in claim 1, further comprising, before said forming of said insulator, forming an etch stop material over said conductor.

5. The method in claim 1, wherein said step of removing said spacer comprises applying an etchant that removes said spacer at a higher rate that said etchant removes said insulator.

6. The method in claim 1, further comprising, before said filling of said gap with said conductor, etching said collar to control a depth of said buried strap.

7. The method in claim 1, wherein said spacer comprises one of Boron Phosphorus Silicate Glass (BPSG), Phosphorus Silicate Glass (PSG) and Boron Silicate Glass (BSG).

8. The method in claim 1, wherein said insulator comprises oxynitride.

9. The method in claim 1, wherein said insulator comprises tetraethylorthosilicate.

10. A method of forming an integrated circuit structure comprising:

forming a trench adjacent a transistor;

forming a spacer on a side of an upper portion of said trench;

forming an insulator in a remainder of said upper portion of said trench;

forming a shallow trench isolation region on one side of said trench opposite said transistor;

removing said spacer to form a gap between said insulator and said transistor; and filling said gap with a conductor to form a buried strap.

11. The method in claim 10, further comprising, before said forming of said spacer:

partially filling said trench with a conductor; and forming a collar surrounding an upper portion of said conductor.

12. The method in claim 10, wherein said step of forming said insulator includes planarizing said insulator over said integrated circuit structure.

13. The method in claim 10, further comprising filling said shallow trench isolation region with an isolation material.

14. The method in claim 11, further comprising, before said forming of said insulator, forming an etch stop material over said conductor.

15. The method in claim 10, wherein said step of removing said spacer comprises applying an etchant that removes said spacer at a higher rate that said etchant removes said insulator.

16. The method in claim 11, further comprising, before said filling of said gap with said conductor, etching said collar to control a depth of said buried strap.

17. The method in claim 10, wherein said spacer comprises one of Boron Phosphorus Silicate Glass (BPSG), Phosphorus Silicate Glass (PSG) and Boron Silicate Glass (BSG).

18. The method in claim 10, wherein said insulator comprises oxynitride.

19. The method in claim 10, wherein said insulator comprises tetraethylorthosilicate.

20. The method in claim 10, where said integrated circuit structure comprises a dynamic random access memory structure.

* * * * *